United States Patent
Doi et al.

(10) Patent No.: US 11,665,809 B2
(45) Date of Patent: May 30, 2023

(54) HIGH-FREQUENCY POWER CIRCUIT, PLASMA TREATMENT APPARATUS, AND PLASMA TREATMENT METHOD

(71) Applicant: ULVAC, INC., Chigasaki (JP)

(72) Inventors: Kenta Doi, Chigasaki (JP); Toshiyuki Nakamura, Chigasaki (JP)

(73) Assignee: ULVAC, INC., Chigaski (JP)

( * ) Notice: Subject to any disclaimer, the term of this patent is extended or adjusted under 35 U.S.C. 154(b) by 0 days.

(21) Appl. No.: 17/634,208

(22) PCT Filed: Aug. 24, 2021

(86) PCT No.: PCT/JP2021/030948
§ 371 (c)(1),
(2) Date: Feb. 9, 2022

(87) PCT Pub. No.: WO2022/107407
PCT Pub. Date: May 27, 2022

(65) Prior Publication Data
US 2022/0377870 A1    Nov. 24, 2022

(30) Foreign Application Priority Data

Nov. 20, 2020  (JP) .............................. JP2020-193677

(51) Int. Cl.
*H05H 1/46*    (2006.01)
*H01J 37/16*   (2006.01)
(Continued)

(52) U.S. Cl.
CPC .............. *H05H 1/46* (2013.01); *H01J 37/16* (2013.01); *H01J 37/244* (2013.01); *H01Q 1/26* (2013.01)

(58) Field of Classification Search
None
See application file for complete search history.

(56) References Cited

U.S. PATENT DOCUMENTS 2,051,503 A * 8/1936 Usselman .............. H03H 2/006
                                                    455/114.1
2,362,692 A * 11/1944 Goldberg ................. H04B 1/50
                                                    332/174
(Continued)

FOREIGN PATENT DOCUMENTS

JP    H08203695 A    8/1996
JP    2005503658 A   2/2005
(Continued)

OTHER PUBLICATIONS

International Application No. PCT/JP2021/030948, Search Report and Written Opinion dated Nov. 9, 2021 (w/ English translation), 15 pgs.

*Primary Examiner* — Srinivas Sathiraju
(74) *Attorney, Agent, or Firm* — Schwegman Lundberg & Woessner, P.A.

(57) ABSTRACT

A high-frequency power circuit includes a first antenna circuit and a second antenna circuit that are connected in parallel to a matching box connected to a high-frequency power supply. The first antenna circuit include a first antenna, a first distribution capacitor, and a first variable capacitor. The second antenna circuit includes a second antenna, a second distribution capacitor, and a second variable capacitor. A controller sets a capacitance of the first variable capacitor based on a detection result of a phase difference between current and voltage in a series-connected portion of the first antenna and the first variable capacitor during plasma production to reduce this phase difference and sets a capacitance of the second variable capacitor based on a detection result of a phase difference between current and voltage in a series-connected portion of the second antenna and the second variable capacitor during plasma production to reduce this phase difference.

9 Claims, 4 Drawing Sheets

(51) Int. Cl.
*H01J 37/244* (2006.01)
*H01Q 1/26* (2006.01)

(56) References Cited

U.S. PATENT DOCUMENTS

| | | | |
|---|---|---|---|
| 5,681,393 | A | 10/1997 | Takagi |
| 10,304,669 | B1 | 5/2019 | Coumou et al. |
| 2003/0067273 | A1 | 4/2003 | Benjamin et al. |
| 2007/0229279 | A1* | 10/2007 | Yamazaki ........... G06K 19/0701 340/572.7 |
| 2007/0278998 | A1* | 12/2007 | Koyama ................. H02J 50/12 320/109 |
| 2009/0026973 | A1* | 1/2009 | Kato ..................... F21K 9/278 315/201 |
| 2009/0207084 | A1* | 8/2009 | Ikeda ................... H01Q 1/1214 343/749 |
| 2009/0207620 | A1* | 8/2009 | Nakayama ............... F21K 9/27 313/11 |
| 2010/0148965 | A1* | 6/2010 | Alexis ................ G06K 19/0723 340/572.1 |
| 2010/0243162 | A1 | 9/2010 | Koshimizu |
| 2012/0000888 | A1 | 1/2012 | Kawasaki et al. |
| 2012/0074100 | A1 | 3/2012 | Yamazawa |
| 2013/0105086 | A1 | 5/2013 | Banna et al. |
| 2013/0106286 | A1 | 5/2013 | Banna et al. |
| 2022/0044938 | A1* | 2/2022 | Doi ..................... H01L 21/3085 |
| 2022/0377870 | A1* | 11/2022 | Doi ...................... H01J 37/244 |
| 2022/0392746 | A1* | 12/2022 | Suzuki ................ H01J 37/3211 |

FOREIGN PATENT DOCUMENTS

| | | | | |
|---|---|---|---|---|
| JP | 2009104947 | A | | 5/2009 |
| JP | 2010238981 | A | | 10/2010 |
| JP | 2012074200 | A | | 4/2012 |
| JP | 2013077715 | A | | 4/2013 |
| JP | 2015501518 | A | | 1/2015 |
| JP | 2020004710 | A * | 1/2020 | ........ H01J 37/32091 |
| JP | 2022183200 | A * | 12/2022 | ........ H01J 37/32091 |
| WO | WO-2019244734 | A1 * | 12/2019 | ........ H01J 37/32091 |

* cited by examiner

HIGH-FREQUENCY POWER CIRCUIT, PLASMA TREATMENT APPARATUS, AND PLASMA TREATMENT METHOD

This application is a U.S. National Stage Filing under 35 U.S.C. 371 from International Application No. PCT/JP2021/030948, filed on Aug. 24, 2021, which claims the benefit of priority under 35 U.S.C. § 119 to Japanese Patent Application No. 2020-193677, filed on Nov. 20, 2020, each of which is incorporated by reference herein in its entirety.

TECHNICAL FIELD

The present invention relates to a high-frequency power circuit, a plasma treatment apparatus, and a plasma treatment method.

BACKGROUND ART

An etching apparatus is an example of a plasma treatment apparatus that uses inductively coupled plasma and includes a first antenna circuit and a second antenna circuit. The first antenna circuit includes a first variable capacitor and a first annular antenna. The second antenna circuit includes a second variable capacitor and a second annular antenna. The first antenna circuit and the second antenna circuit are connected in parallel to the same matching box. A high frequency power supply provides the first annular antenna and the second annular antenna with high-frequency power through the matching box.

When the capacitance of the first variable capacitor is changed, the impedance of the first antenna circuit changes. When the capacitance of the second variable capacitor is changed, the impedance of the second antenna circuit changes. The ratio of the impedance of the first antenna circuit and the impedance of the second antenna circuit is controlled and adjusted to a predetermined value so that the ratio of the current flowing through the first annular antenna and the current flowing through the second annular antenna is adjusted to a predetermined value. This regulates the density distribution of plasma (for example, refer to Patent Literature 1).

CITATION LIST

Patent Literature

Patent Literature 1: Japanese Laid-Open Patent Publication No. 2013-77715

SUMMARY OF INVENTION

Technical Problem

The impedance of a transmission system in a state in which plasma is not produced is determined based on the characteristic values of circuit elements such as the variable capacitors and the annular antennas. In a parallel circuit including multiple antenna circuits, the impedances of the antenna circuits are set by setting the capacitances of the variable capacitors. This allows for determination of the theoretical value of a current distribution ratio that is a ratio of the current flowing through the first annular antenna and the current flowing through the second annular antenna.

In a state in which plasma is produced, an impedance component is generated by the plasma production in the transmission system as a new circuit constant. Thus, the plasma production changes the impedance of the transmission system in a state in which plasma is produced and the impedance deviates from the theoretical value, which is determined based on the characteristic values of circuit elements. Further, the impedance component generated by the plasma production greatly varies in accordance with a production condition such as the pressure or the gas type in the plasma space. As a result, even when the capacitances of the variable capacitors are controlled to predetermined values in advance, the actual current distribution ratio in the antenna circuits still deviates from the theoretical value.

Solution to Problem

In one general aspect, a high-frequency power circuit includes a first antenna circuit in which first circuit elements are connected in series and a second antenna circuit in which second circuit elements are connected in series. The first antenna circuit and the second antenna circuit are connected in parallel to a matching box that is connected to a high-frequency power supply. The high-frequency power circuit further includes a controller that controls and drives the first circuit elements and the second circuit elements. The first circuit elements include a first antenna for plasma production, a first distribution capacitor located between the first antenna and the matching box, and a first variable capacitor. The second circuit elements include a second antenna for plasma production, a second distribution capacitor located between the second antenna and the matching box, and a second variable capacitor. The controller sets a capacitance of the first variable capacitor based on a detection result of a phase difference between current and voltage in a series-connected portion of the first antenna and the first variable capacitor during plasma production so as to reduce the phase difference between current and voltage in the series-connected portion of the first antenna and the first variable capacitor. Further, the controller sets a capacitance of the second variable capacitor based on a detection result of a phase difference between current and voltage in a series-connected portion of the second antenna and the second variable capacitor during plasma production so as to reduce the phase difference between current and voltage in the series-connected portion of the second antenna and the second variable capacitor.

In another general aspect, a plasma treatment apparatus includes a vacuum chamber and a high-frequency power circuit arranged outside the vacuum chamber to produce plasma. The high-frequency power circuit is the above described high-frequency power circuit.

In one general aspect, a plasma treatment method includes supplying a gas into a vacuum chamber and supplying high-frequency power to the vacuum chamber from a high-frequency power circuit. The high-frequency power circuit includes a first antenna circuit in which first circuit elements are connected in series and a second antenna circuit in which second circuit elements are connected in series. The first antenna circuit and the second antenna circuit are connected in parallel to a matching box that is connected to a high-frequency power supply. The first circuit elements include a first antenna for plasma production, a first distribution capacitor located between the first antenna and the matching box, and a first variable capacitor. The second circuit elements include a second antenna for plasma production, a second distribution capacitor located between the second antenna and the matching box, and a second variable capacitor. The supplying the high-frequency power includes setting a capacitance of the first variable capacitor based on a detection result of a phase difference between current and voltage in a series-connected portion of the first antenna and the first variable capacitor so as to reduce the phase difference between current and voltage in a series-connected portion of the first antenna and the first variable capacitor. Further, the supplying the high-frequency power includes setting a capacitance of the second variable capacitor based on a detection result of a phase difference between current and voltage in a series-connected portion of the second antenna and the second variable capacitor so as to reduce the phase difference between current and voltage in a series-connected portion of the second antenna and the second variable capacitor.

The current distribution ratio that is a ratio of the current value of the first antenna and the current value of the second antenna is determined based on a ratio of the impedance of the first antenna circuit and the impedance of the second antenna circuit. In a state in which plasma is not produced, such a current distribution ratio is theoretically obtained based on a ratio of the combined impedance of the first circuit elements and the combined impedance of the second circuit elements. However, in a state in which plasma is produced, the plasma production generates an impedance component in the impedance of each antenna circuit as a circuit constant. This deviates the actual current distribution ratio from the current distribution ratio that is theoretically obtained in a state in which plasma is not produced.

In this respect, the above configuration sets the capacitance of the first variable capacitor to reduce the phase difference between current and voltage in the series-connected portion of the first antenna and the first variable capacitor during plasma production. In other words, the capacitance of the first variable capacitor reduces the phase difference between the current flowing through the first antenna and the first variable capacitor, which are connected in series, and the voltage applied to the first antenna and the first variable capacitor, which are connected in series. Accordingly, the first antenna and the first variable capacitor may be in a substantially resonating state. Further, the capacitance of the second variable capacitor is set to reduce the phase difference between the current and the voltage in the series-connected portion of the second antenna and the second variable capacitor during plasma production. Accordingly, the second antenna and the second variable capacitor may be in a substantially resonating state. As a result, even in a state in which plasma is produced, the impedance of the first antenna circuit and the impedance of the second antenna circuit are dominantly determined by the first distribution capacitor and the second distribution capacitor, respectively. Thus, the ratio of the impedance of the first antenna circuit and the impedance of the second antenna circuit corresponds to the ratio that is theoretically obtained in a state in which plasma is not produced. This facilitates transmission of the high-frequency power provided by the high-frequency power supply to both of the first antenna and the second antenna and minimizes the deviation between the actual current distribution ratio and the current distribution ratio that is theoretically obtained in a state in which plasma is not produced.

In an antenna circuit through which a large current flows, such as an LC parallel circuit, each circuit element in the antenna circuit potentially has a thermally unstable characteristic. In this respect, the above first antenna circuit and the second antenna circuit are series circuits that do not include an LC parallel circuit, thereby inhibiting the thermal instability that the circuit elements have.

In the high-frequency power circuit, the first antenna may be located between the first distribution capacitor and the first variable capacitor, and the second antenna may be located between the second distribution capacitor and the second variable capacitor.

With this configuration, the first variable capacitor that is located at an output side of the first antenna and the second variable capacitor that is located at an output side of the second antenna each reduces the phase difference between the current and the voltage in the corresponding series-connected portion of the corresponding antenna and the corresponding variable capacitor. This minimizes the deviation between the actual current distribution ratio and the current distribution ratio that is theoretically obtained in a state in which plasma is not produced.

In the high-frequency power circuit, the first variable capacitor may be located between the first distribution capacitor and the first antenna, and the second variable capacitor may be located between the second distribution capacitor and the second antenna. In other words, the first variable capacitor may be located at an input side of the first antenna, and the second variable capacitor may be located at an input side of the second antenna. This configuration also reduces the phase difference between the current and the voltage in the series-connected portion of the corresponding antenna and variable capacitor and minimizes the deviation between the actual current distribution ratio and the current distribution ratio that is theoretically obtained in a state in which plasma is not produced.

The above high-frequency power circuit may include a first current detector that detects current in the first antenna, a first voltage detector that detects voltage at the first antenna, a second current detector that detects current in the second antenna, and a second voltage detector that detects voltage at the second antenna. Based on a detection result of the first current detector and the first voltage detector, the controller may set the capacitance of the first variable capacitor so as to match a phase of current with a phase of voltage in the series-connected portion of the first antenna and the first variable capacitor. Further, based on a detection result of the second current detector and the second voltage detector, the controller may set the capacitance of the second variable capacitor so as to match a phase of current with a phase of voltage in the series-connected portion of the second antenna and the second variable capacitor.

With the above configuration, the capacitance of the first variable capacitor is set to match the phase of the current detected 1w the first current detector with the phase of the voltage detected by the first voltage detector. Further, the capacitance of the second variable capacitor is set to match the phase of the current detected by the second current detector with the phase of the voltage detected by the second voltage detector. This further effectively minimizes the deviation between the actual current distribution ratio and the current distribution ratio that is theoretically obtained in a state in which plasma is not produced.

In the above high-frequency power circuit, each of the first distribution capacitor and the second distribution capacitor may be a variable capacitor. The controller may perform a process for setting a target value for a ratio of a current value of the first antenna and a current value of the second antenna before the high-frequency power supply provides power. The process may include driving the first distribution capacitor in cooperation with the second distribution capacitor and setting the capacitance of each of the first distribution capacitor and the second distribution capacitor such that the capacitance of the second distribution capacitor decreases as the capacitance of the first distribution capacitor increases.

The above configuration drives the first distribution capacitor in cooperation with the second distribution capacitor and sets the capacitance of the first distribution capacitor and the capacitance of the second distribution capacitor before the high-frequency power supply provides power. In other words, the theoretically obtained current distribution ratio can be set before producing plasma. Thus, even at various current distribution ratios, the deviation is effectively minimized between the actual current distribution ratio and the current distribution ratio that is theoretically obtained in a state in which plasma is not produced.

In the above high-frequency power circuit, the first voltage detector may separately detect voltage at each of two terminals of the first antenna. The controller may reset the capacitance of the first variable capacitor and the capacitance of the first distribution capacitor so as to change voltage distribution in the first antenna obtained from a detection result of the first voltage detector while maintaining a combined capacitance of the capacitance of the first variable capacitor and the capacitance of the first distribution capacitor that are set to reduce the phase difference between current and voltage in the series-connected portion of the first antenna and the first variable capacitor based on the detection result of the phase difference between current and voltage in the series-connected portion of the first antenna and the first variable capacitor.

Further, in the above high-frequency power circuit, the second voltage detector may separately detect voltage at each of two terminals of the second antenna. The controller may reset the capacitance of the second variable capacitor and the capacitance of the second distribution capacitor so as to change voltage distribution in the second antenna obtained from a detection result of the second voltage detector while maintaining a combined capacitance of the capacitance of the second variable capacitor and the capacitance of the second distribution capacitor that are set to reduce the phase difference between current and voltage in the series-connected portion of the second antenna and the second variable capacitor based on the detection result of the phase difference between current and voltage in the series-connected portion of the second antenna and the second variable capacitor.

The above configuration resets the capacitance of the first variable capacitor and the capacitance of the first distribution capacitor to change the voltage distribution in the first antenna while maintaining the combined capacitance of the capacitance of the first variable capacitor and the capacitance of the first distribution capacitor that are set to reduce the phase difference. Thus, the distribution of plasma produced by the first antenna can be changed while minimizing the deviation between the actual current distribution ratio and the current distribution ratio that is theoretically obtained in a state in which plasma is not produced. Further, the capacitance of the second variable capacitor and the capacitance of the second distribution capacitor are reset to change the voltage distribution in the second antenna while maintaining the combined capacitance of the capacitance of the second variable capacitor and the capacitance of the second distribution capacitor that are set to reduce the phase difference. Thus, the distribution of plasma produced by the second antenna can be changed while minimizing the deviation between the actual current distribution ratio and the current distribution ratio that is theoretically obtained in a state in which plasma is not produced. Since the first antenna and the second antenna are arranged at different positions, with the configuration in which the plasma distribution is separately changed in the first antenna and the second antenna, the plasma distribution can be adjusted in detail with respect to a subject.

The high-frequency power circuit, the plasma treatment apparatus, and the plasma treatment method in accordance with the present invention minimize the deviation between the actual current distribution ratio and the current distribution ratio that is theoretically obtained in a state in which plasma is not produced.

DESCRIPTION OF EMBODIMENTS

An embodiment of a high-frequency power circuit, a plasma treatment apparatus, and a plasma treatment method will now be described with reference to FIGS. 1 to 6. A plasma treatment apparatus may be, for example, an etching apparatus that etches a thin film or a subject such as a substrate, a thin-film formation apparatus that forms a thin film on a subject such as a substrate in a gas phase, or a surface treatment apparatus that irradiates a subject such as a substrate with plasma. A subject that is treated by a plasma treatment method using the plasma treatment apparatus may be a substrate or a sheet for various types of devices such as a semiconductor device or a display device. Alternatively, the subject may be various types of substrates that require surface treatment with plasma.

Figure 1:
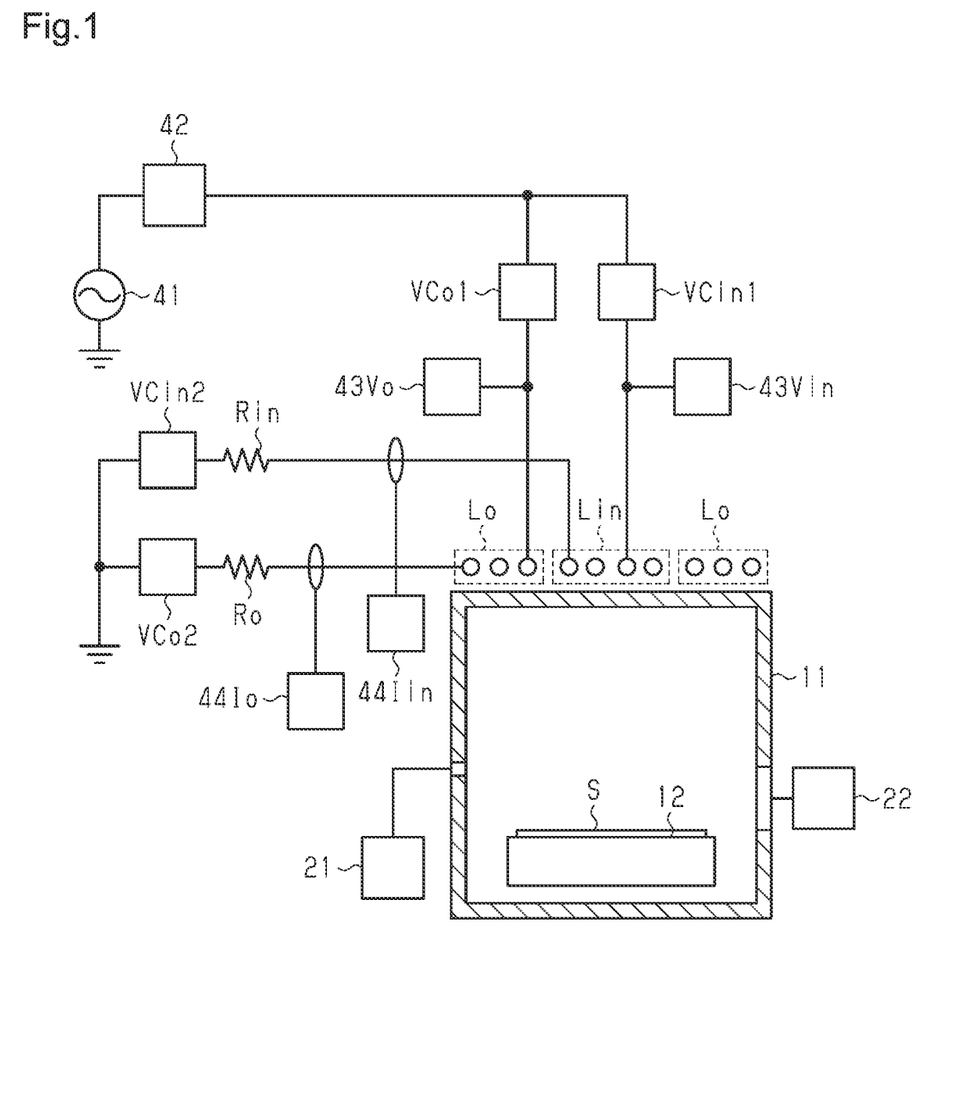
FIG. 1 is a block diagram showing the configuration of a plasma treatment apparatus in accordance with an embodiment.

As shown in FIG. 1, a plasma treatment apparatus includes a vacuum chamber 11, a gas supply unit 21, a discharge unit 22, and a high-frequency power circuit. The vacuum chamber 11 accommodates a stage 12. A subject S of plasma treatment is set on the stage 12. The gas supply unit 21 supplies various types of gases to the vacuum chamber 11 to produce plasma. The discharge unit 22 adjusts the internal pressure of the vacuum chamber 11 to the pressure for plasma production.

High-Frequency Power Circuit

The high-frequency power circuit includes an inner antenna Lin, an inner distribution capacitor VCin1, and an inner resonance capacitor VCin2. The inner antenna Lin, the inner distribution capacitor VCin1, and the inner resonance capacitor VCin2 are connected in series.

The inner antenna Lin is located between the inner distribution capacitor VCin1 and the inner resonance capacitor VCin2. The inner antenna Lin is a plasma production annular antenna, for example, a three-winding antenna having a diameter of 110 mm. The inner antenna Lin may be arranged in the central part of the top surface of the vacuum chamber 11 or another part of the top surface of the vacuum chamber 11. To facilitate understanding, FIG. 1 shows an inner resistance Rin that is a resistance component of the inner antenna Lin.

The inner distribution capacitor VCin1 is a variable capacitor and is connected to an input terminal of the inner antenna Lin that receives high-frequency power. The inner resonance capacitor VCin2 is a variable capacitor and is connected to an output terminal of the inner antenna Lin that outputs high-frequency power.

The inner antenna Lin, the inner distribution capacitor VCin1 and the inner resonance capacitor VCin2 are each an example of a first circuit element. The series circuit including the inner antenna Lin, the inner distribution capacitor VCin1, and the inner resonance capacitor VCin2 is an example of a first antenna circuit. The inner antenna Lin is an example of a first antenna. The inner distribution capacitor VCin1 is an example of a first distribution capacitor. The inner resonance capacitor VCin2 is an example of a first variable capacitor.

The plasma treatment apparatus includes an inner voltage detector 43Vin and an inner current detector 44Iin. The inner voltage detector 43Vin detects an input terminal voltage of the inner antenna Lin between the inner distribution capacitor VCin1 and the inner antenna Lin as an example of the voltage at the inner antenna Lin. The input terminal voltage at the inner antenna Lin is an example of the voltage at the series-connected portion connected of the inner antenna Lin and the inner resonance capacitor VCin2. The inner current detector 44Iin detects the current flowing through the series-connected portion of the inner antenna Lin and the inner resonance capacitor VCin2 as an example of the current flowing through the inner antenna Lin. The inner voltage detector 43Vin is an example of a first voltage detector that detects the voltage at the series-connected portion of the first antenna and the first variable capacitor. The inner current detector 44Iin is an example of a first current detector that detects the current in the series-connected portion of the first antenna and the first variable capacitor.

The high-frequency power circuit includes an outer antenna Lo, an outer distribution capacitor VCo1, and an outer resonance capacitor VCo2. The outer antenna Lo, the outer distribution capacitor VCo1, and the outer resonance capacitor VCo2 are connected in series.

The outer antenna Lo is located between the outer distribution capacitor VCo1 and the outer resonance capacitor VCo2. The outer antenna Lo is a plasma production annular antenna, for example, a two-winding antenna having a diameter of 260 mm. The outer antenna Lo may be arranged in the peripheral part of the top surface of the vacuum chamber 11 to surround the inner antenna Lin. Alternatively, the outer antenna Lo may be arranged in another part of the top surface of the vacuum chamber 11 next to the inner antenna Lin. To facilitate understanding, FIG. 1 shows an outer resistance Ro that is a resistance component of the outer antenna Lo.

The outer distribution capacitor VCo1 is a variable capacitor and is connected to an input terminal of the outer antenna Lo that receives high-frequency power. The outer resonance capacitor VCo2 is a variable capacitor and is connected to an output terminal of the outer antenna Lo that outputs high-frequency power.

The outer antenna Lo, the outer distribution capacitor VCo1, and the outer resonance capacitor VCo2 are each an example of a second circuit element. The series circuit including the outer antenna Lo, the outer distribution capacitor VCo1, and the outer resonance capacitor VCo2 is an example of a second antenna circuit. The outer antenna Lo is an example of a second antenna. The outer distribution capacitor VCo1 is an example of a second distribution capacitor. The outer resonance capacitor VCo2 is an example of a second variable capacitor.

The plasma treatment apparatus includes an outer voltage detector 43Vo and an outer current detector 44Io. The outer voltage detector 43Vo detects an input terminal voltage at the outer antenna Lo between the outer distribution capacitor VCo1 and the outer antenna Lo as an example of the voltage at the outer antenna Lo. The input terminal voltage at the outer antenna Lo is an example of the voltage at the series-connected portion of the outer antenna Lo and the outer resonance capacitor VCo2. The outer current detector 44Io detects the current flowing through the series-connected portion of the outer antenna Lo and the outer resonance capacitor VCo2 as an example of the current flowing through the outer antenna Lo. The outer voltage detector 43Vo is an example of a second voltage detector that detects the voltage at the series-connected portion of the second antenna and the second variable capacitor. The outer current detector 44Io is an example of a second current detector that detects the current in the series-connected portion of the second antenna and the second variable capacitor.

The series circuit including the inner antenna Lin, the inner distribution capacitor VCin1, and the inner resonance capacitor VCin2 and the series circuit including the outer antenna Lo, the outer distribution capacitor VCo1, and the outer resonance capacitor VCo2 are connected in parallel to a matching box 42 that is connected to a high-frequency power supply 41. The matching box 42 equalizes the impedance of the high-frequency power supply 41, which is the power transmitting side, and the impedance of the power receiving side, that is, the impedance of load including the matching box 42 and the high-frequency power circuit, to the characteristic impedance.

Figure 2:
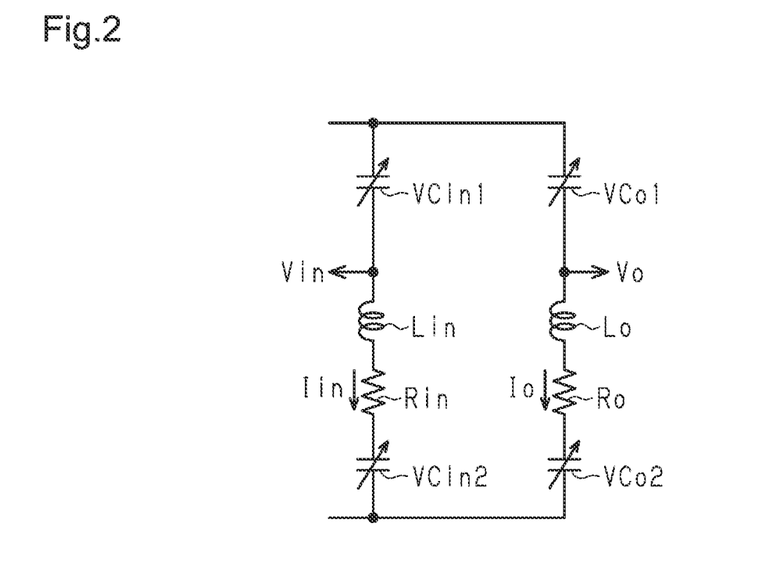
FIG. 2 is a circuit diagram showing the configuration of a high-frequency power circuit in accordance with the embodiment.

As shown in FIG. 2, the equivalent circuit of the high-frequency power circuit includes a series circuit including the inner distribution capacitor VCin1, the inner antenna Lin, the inner resistance Rin, which is the resistance component of the inner antenna Lin, and the inner resonance capacitor VCin2. The equivalent circuit of the high-frequency power circuit includes a series circuit including the outer distribution capacitor VCo1, the outer antenna Lo, the outer resistance Ro that is the resistance component of the outer antenna Lo, and the outer resonance capacitor VCo2. The equivalent circuit of the high-frequency power circuit is illustrated as a parallel circuit of the two series circuits.

The inner voltage detector 43Vin detects an inner input terminal voltage Vin that is the input terminal voltage at the inner antenna Lin. The outer voltage detector 43Vo detects an outer input terminal voltage Vo that is the input terminal voltage at the outer antenna Lo. The inner current detector detects an inner antenna current Iin that flows through the inner antenna Lin. The outer current detector 44Io detects an outer antenna current Io that flows through the outer antenna Lo.

Controller

Figure 3:
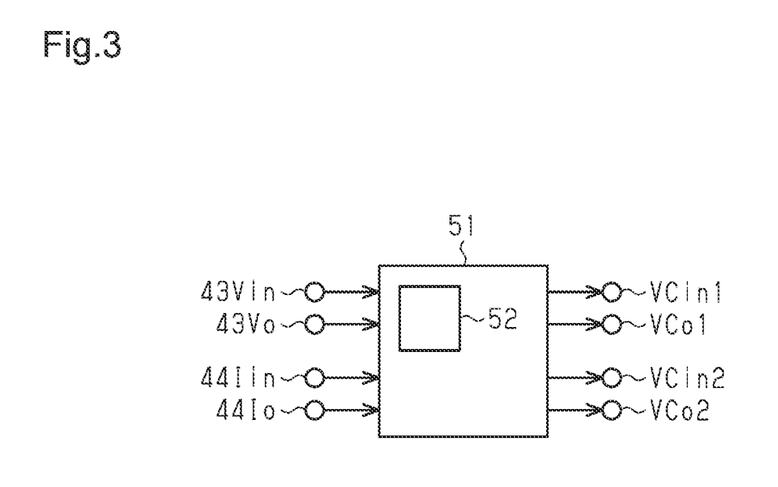
FIG. 3 is a block diagram showing the configuration of a controller included in the plasma treatment apparatus.

As shown in FIG. 3, the high-frequency power circuit includes a controller 51 that controls and drives the variable capacitors. The controller 51 includes, for example, software and hardware elements used for a computer such as a central processing unit (CPU), a random-access memory (RAM), and a read-only memory (ROM). The controller 51 is not limited to a device that executes all processes with software. For example, the controller 51 may include an application specific integrated circuit (ASIC) that is dedicated hardware to execute at least some processes. The controller 51 may be circuitry that includes 1) one or more hardware circuits such as an ASIC, 2) a microcomputer including one or more processors that run on software (computer program), or 3) a combination of the above.

The controller 51 stores various programs and data for executing a plasma treatment method. The controller 51 stores control data 52 used to control and drive the variable capacitors. The controller 51 reads programs for executing a plasma treatment method and executes processes according to the programs. The plasma treatment method includes a distribution process for setting a target value for a current distribution ratio and a matching process for driving the variable capacitors so as to match the current distribution ratio with the target value. The controller 51 performs the distribution process in a state in which plasma is not produced. The controller 51 performs the matching process in a state in which plasma is produced.

Distribution Process

The current distribution ratio is a ratio of the current value of the outer antenna Lo and the current value of the inner antenna Lin. The current distribution ratio may be a ratio of the current value of the inner antenna Lin to the current value of the outer antenna Lo or a ratio of the current value of the outer antenna Lo to the current value of the inner antenna Lin.

The controller 51 uses the control data 52 to perform the distribution process. The controller 51 performs the distribution process by driving the inner distribution capacitor VCin1 and the outer distribution capacitor VCo1 and setting the capacitance of the inner distribution capacitor VCin1 and the capacitance of the outer distribution capacitor VCo1 to values for obtaining the target value of the current distribution ratio.

The control data 52 is used for outputting the capacitance of the inner distribution capacitor VCin1 and the capacitance of the outer distribution capacitor VCo1 based on an input of the current distribution ratio. The control data 52 is theoretically calculated in advance from the high-frequency power circuit in a state in which plasma is not produced. The control data 52 may be a table that associates the current distribution ratio with the capacitance of the inner distribution capacitor VCin1 and the capacitance of the outer distribution capacitor VCo1. The control data 52 may be a relational expression used for outputting the capacitance of the inner distribution capacitor VCin1 and the capacitance of the outer distribution capacitor VCo1 based on an input of the current distribution ratio.

In an example, the control data 52 includes capacitance distribution ratio correlation data and capacitance correlation data. The capacitance distribution ratio correlation data is used for outputting one of the capacitance of the inner distribution capacitor VCin1 and the capacitance of the outer distribution capacitor VCo1 based on an input of the current distribution ratio. The capacitance distribution ratio correlation data may be a table or a relational expression. The capacitance correlation data is used for outputting one of the capacitance of the inner distribution capacitor VCin1 and the capacitance of the outer distribution capacitor VCo1 based on an input of the other one of the capacitance of the inner distribution capacitor VCin1 and the capacitance of the outer distribution capacitor VCo1. The capacitance correlation data may be a table or a relational expression.

Figure 4:
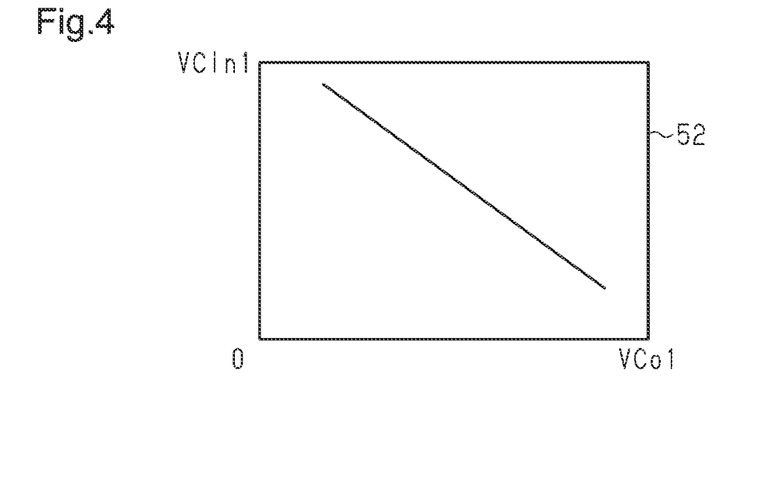
FIG. 4 is a graph illustrating the control value relationship of an inner distribution capacitance and an outer distribution capacitance.

As shown in FIG. 4, an example of the capacitance correlation data is a table that associates the capacitance of the inner distribution capacitor VCin1 with the capacitance of the outer distribution capacitor VCo1. In the example of the capacitance correlation data, each capacitance of the inner distribution capacitor VCin1 is associated with the corresponding capacitance of the outer distribution capacitor VCo1. In the example of the capacitance correlation data, the capacitance of the inner distribution capacitor VCin1 decreases as the capacitance of the outer distribution capacitor VCo1 increases.

Figure 5:
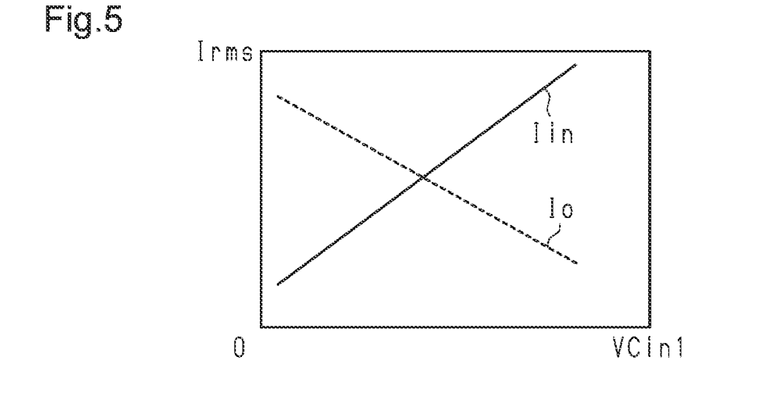
FIG. 5 is a graph illustrating the relationship between the inner distribution capacitance and a current distribution ratio.

As shown in FIG. 5, an example of the capacitance distribution ratio correlation data is a table that associates the capacitance of the inner distribution capacitor VCin1 with the current distribution ratio. In the example of the capacitance distribution ratio correlation data, each capacitance of the inner distribution capacitor VCin1 is associated with a current value Irms of the inner antenna Lin (inner antenna current IIn in FIG. 5) and a current value Irms of the outer antenna Lo (outer antenna current Io in FIG. 5). In the example of the capacitance distribution ratio correlation data, as the capacitance of the inner distribution capacitor VCin1 increases, the current value Irms of the inner antenna Lin increases and the current value Irms of the outer antenna Lo decreases. In the example of the capacitance distribution ratio correlation data, the current value Inns of the inner antenna Lin and the current value Irms of the outer antenna Lo may be associated with the capacitance of the outer distribution capacitor VCo1.

The controller 51 uses the capacitance distribution ratio correlation data to obtain the capacitance of one of the inner distribution capacitor VCin1 and the outer distribution capacitor VCo1 from the current distribution ratio. The controller 51 uses the capacitance correlation data to obtain the capacitance of one of the inner distribution capacitor VCin1 and the outer distribution capacitor VCo1 based on the capacitance of the other one of the inner distribution capacitor VCin1 and the outer distribution capacitor VCo1. In this manner, the controller 51 drives one of the inner distribution capacitor VCin1 and the outer distribution capacitor VCo1 in cooperation with the other one of the inner distribution capacitor VCin1 and the outer distribution capacitor VCo1.

Matching Process

Returning to FIG. 3, the controller 51 performs the matching process based on inputs of a detection result of the inner voltage detector 43Vin and a detection result of the inner current detector 44Iin. The controller 51 performs the matching process by calculating a phase difference between the current and the voltage in the series-connected portion of the inner antenna Lin and the inner resonance capacitor VCin2 and setting the capacitance of the inner resonance capacitor VCin2 to reduce the phase difference. The controller 51 repeatedly performs the matching process over a period during which plasma is produced. The controller 51 may perform the matching process in cycles in which the detection result of the inner voltage detector 43Vin and the detection result of the inner current detector 44Iin are input. Alternatively, the controller may perform the matching process in predetermined control cycles differing from the above cycles.

In an example of the matching process, the controller 51 obtains the phase of the voltage provided to the inner antenna Lin from the detection result of the inner voltage detector 43Vin. Further, the controller 51 obtains the phase of the current flowing through the inner antenna Lin from the detection result of the inner current detector 44Iin. Then, the controller 51 calculates the capacitance of the inner resonance capacitor VCin2 based on the phases so as to match the phase of the voltage, which is provided to the series-connected portion of the inner antenna Lin and the inner resonance capacitor VCin2, with the phase of the current, which flows through the series-connected portion of the inner antenna Lin and the inner resonance capacitor VCin2. The controller 51 drives the inner resonance capacitor VCin2 to set the capacitance of the inner resonance capacitor VCin2 to the calculation value.

In a state in which plasma is produced, the plasma production generates an impedance component in the impedance of the antenna circuit as a circuit constant. This deviates the actual resonance condition from the resonance condition that is theoretically obtained in a state in which plasma is not produced. The controller 51 matches the phase of the voltage provided to the inner antenna Lin with the phase of the current flowing through the inner antenna Lin. In other words, the controller 51 continues to dynamically set the capacitance of the inner resonance capacitor VCin2 to minimize the deviation between the actual resonance condition and the theoretically obtained resonance condition.

The controller 51 further performs the matching process based on inputs of a detection result of the outer voltage detector 43Vo and a detection result of the outer current detector 44Io. As the matching process, the controller 51 calculates a phase difference between the current and the voltage in the series-connected portion of the outer antenna Lo and the outer resonance capacitor VCo2 and sets the capacitance of the outer resonance capacitor VCo2 to reduce the phase difference.

In an example of the matching process, the controller 51 obtains the phase of the voltage provided to the outer antenna Lo from the detection result of the outer voltage detector 43Vo. Further, the controller 51 obtains the phase of the current flowing through the outer antenna Lo from the detection result of the outer current detector 44Io. Then, the controller 51 calculates the capacitance of the outer resonance capacitor VCo2 based on the phases so as to match the phase of the voltage, which is provided to the series-connected portion of the outer antenna Lo and the outer resonance capacitor VCo2, with the phase of the current, which flows through the series-connected portion of the outer antenna Lo and the outer resonance capacitor VCo2. The controller 51 drives the outer resonance capacitor VCo2 to set the capacitance of the outer resonance capacitor VCo2 to the calculation value.

The controller 51 matches the phase of the voltage provided to the outer antenna Lo with the phase of the current flowing through the outer antenna Lo. In other words, the controller 51 dynamically sets the capacitance of the outer resonance capacitor VCo2 at the same time as when setting the capacitance of the inner resonance capacitor VCin2 to minimize the deviation between the actual resonance condition and the theoretically obtained resonance condition.

Figure 6:
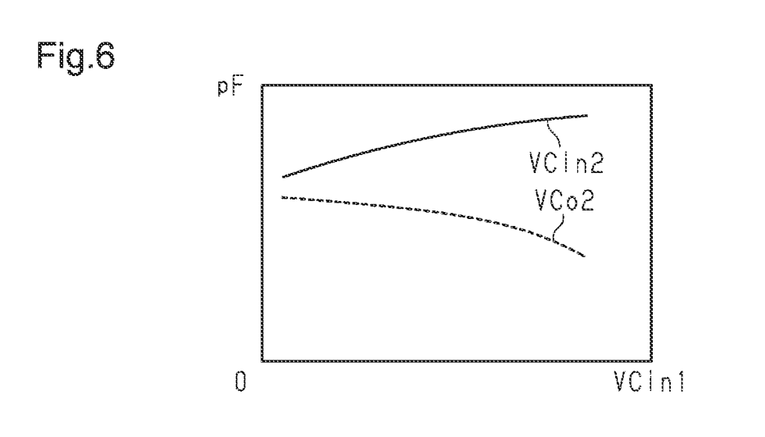
FIG. 6 is a graph illustrating the relationship between the inner distribution capacitance and a resonance capacitance.

FIG. 6 illustrates an example of the relationship of the capacitance of the inner distribution capacitor VCin1 that is set by the distribution process and the actual measurement of the capacitance of the inner resonance capacitor VCin2 that is set by the matching process. Further, FIG. 6 illustrates an example of the relationship of the capacitance of the inner distribution capacitor VCin1 that is set by the distribution process and the actual measurement of the capacitance of the outer resonance capacitor VCo2 that is set by the matching process. As described above, in the distribution process for setting the capacitance of the inner distribution capacitor VCin1, the capacitance of the outer distribution capacitor VCo1 is unambiguously set based on the control data 52 whenever the capacitance of the inner distribution capacitor VCin1 is set.

As shown in FIG. 6, the capacitance of the inner resonance capacitor VCin2 gradually increases as the capacitance of the inner distribution capacitor VCin1 increases, or as the current value of the inner antenna Lin increases. The relationship between the degree of change in the capacitance of the inner resonance capacitor VCin2 and the degree of change in the capacitance of the inner distribution capacitor VCin1 is not fixed and may vary depending on changes in a production condition such as the current distribution ratio and the degree of change in the impedance component generated by plasma production.

Also, the capacitance of the outer resonance capacitor VCo2 gradually decreases as the capacitance of the inner distribution capacitor VCin1 increases. The relationship between the degree of change in the capacitance of the outer resonance capacitor Vco2 and the degree of change in the capacitance of the inner distribution capacitor VCin1 is not fixed and may vary depending on changes in a production condition such as the current distribution ratio and the degree of change in the impedance component generated by plasma production.

Thus, when the capacitance of the inner distribution capacitor VCin1 changes, the virtual impedance of the inner antenna Lin may be changed by the impedance component generated by plasma production and the like. Further, the impedance component generated by plasma production may vary in accordance with, for example, the situation of the subject S and the condition of the vacuum chamber 11 in the plasma treatment. In this respect, the capacitance of the inner resonance capacitor VCin2 is dynamically changed to minimize the phase difference between the current and the voltage in the series-connected portion of the inner antenna Lin and the inner resonance capacitor VCin2, which is resulting from changes in the impedance component generated by plasma production. Simultaneously, the capacitance of the outer resonance capacitor VCo2 is dynamically changed to minimize the phase difference between the current and the voltage in the series-connected portion of the outer antenna Lo and the outer resonance capacitor VCo2, which is resulting from changes in the impedance component generated by plasma production.

In this manner, the series-connected portion of the inner antenna Lin and the inner resonance capacitor VCin2 may be in a substantially resonating state, and the series-connected portion of the outer antenna Lo and the outer resonance capacitor VCo2 may be in a substantially resonating state. This minimizes the deviation between the ratio of the impedance of the series circuit including the inner antenna Lin and the impedance of the series circuit including the outer antenna Lo and the ratio that is theoretically obtained in a state in which plasma is not produced.

Plasma Treatment Method

The plasma treatment method performed by the plasma treatment apparatus will now be described as the operation of the plasma treatment apparatus. As described above, the plasma treatment method includes the distribution process for setting the target value of the current distribution ratio and the matching process for driving the variable capacitors so as to match the current distribution ratio with the target value.

First, the plasma treatment apparatus accommodates the subject S in the vacuum chamber 11. Then, the plasma treatment apparatus supplies gas for plasma production from the gas supply unit 21 into the vacuum chamber 11. Further, the plasma treatment apparatus adjusts the internal pressure of the vacuum chamber 11 to the pressure for plasma production.

Meanwhile, the controller 51 refers to the current distribution ratio, which is a condition for producing plasma, and performs the distribution process using the control data 52. Specifically, the controller 51 drives the inner distribution capacitor VCin1 and the outer distribution capacitor VCo1 and sets the capacitance of the inner distribution capacitor VCin1 and the capacitance of the outer distribution capacitor VCo1 to values allowing the target value of the current distribution ratio to be obtained.

Subsequently, the plasma treatment apparatus provides high-frequency power from the high-frequency power supply 41 and produces plasma inside the vacuum chamber 11. Meanwhile, the controller 51 performs the matching process based on inputs of the detection result of the inner voltage detector 43Vin and the detection result of the inner current detector 44Iin. Specifically, the controller 51 calculates the phase difference between the current and the voltage in the series-connected portion of the inner antenna Lin and the inner resonance capacitor VCin2 and continues to dynamically set the capacitance of the inner resonance capacitor VCin2 to reduce the phase difference. Simultaneously, the controller 51 calculates the phase difference between the current and the voltage in the series-connected portion of the outer antenna Lo and the outer resonance capacitor VCo2 and continues to dynamically set the capacitance of the outer resonance capacitor VCo2 to reduce the phase difference.

The above embodiment has the following advantages.

(1) The capacitance of the inner resonance capacitor VCin2 is set to reduce the phase difference between the current and the voltage in the series-connected portion of the inner antenna Lin and the inner resonance capacitor VCin2 during plasma production. Further, the capacitance of the outer resonance capacitor VCo2 is set to reduce the phase difference between the current and the voltage in the series-connected portion of the outer antenna Lo and the outer resonance capacitor VCo2 during plasma production. In this manner, even in a state in which plasma is produced, the ratio of the impedance of the series circuit including the inner antenna Lin and the impedance of the series circuit including the outer antenna Lo corresponds to the ratio that is theoretically obtained in a state in which plasma is not produced. As a result, the deviation is minimized between the actual current distribution ratio and the current distribution ratio that is theoretically obtained in a state in which plasma is not produced.

(2) In an antenna circuit through which a large current flows, such as an LC parallel circuit, each circuit element in the antenna circuit potentially has a thermally unstable characteristic. In this respect, the high-frequency power circuit is formed by a series circuit that does not include an LC parallel circuit, thereby inhibiting the thermal instability that the circuit elements such as the antennas or the variable capacitors potentially have.

(3) The capacitance of the inner resonance capacitor VCin2 is set to match the phase of the current with the phase of the voltage in the series-connected portion of the inner antenna Lin and the inner resonance capacitor VCin2 during plasma production. Further, the capacitance of the outer resonance capacitor VCo2 is set to match the phase of the current with the phase of the voltage in the series-connected portion of the outer antenna Lo and the outer resonance capacitor VCo2 during plasma production. This increases the effectivity of advantage (1).

(4) The control data 52 is used to drive the inner distribution capacitor VCin1 in cooperation with the outer distribution capacitor VCo1 so that the capacitance of the inner distribution capacitor VCin1 and the capacitance of the outer distribution capacitor VCo1 are set before the high-frequency power supply 41 provides power. Thus, advantage (1) can be obtained at various current distribution ratios.

The above embodiment may be modified as described below. Further, the above embodiment and the following modifications can be combined as long as the combined modifications remain technically consistent with each other.

Figure 7:
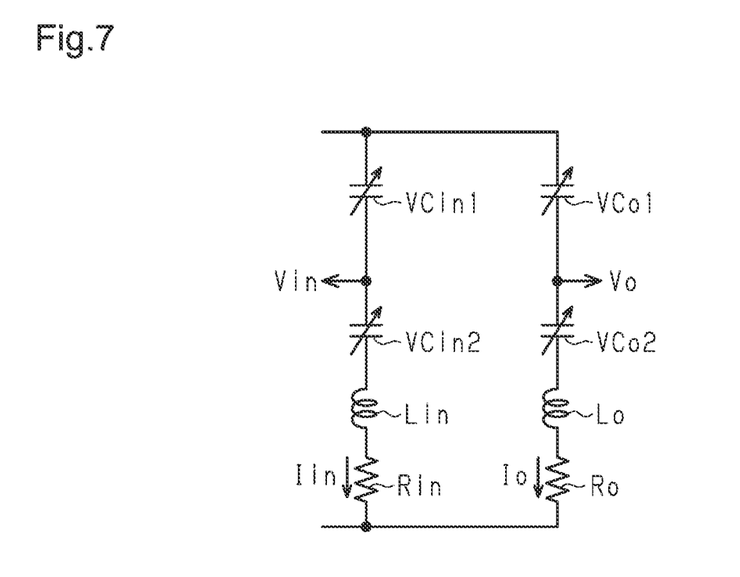
FIG. 7 is a circuit diagram showing the configuration of a high-frequency power circuit in accordance with a modified example.

As shown in FIG. 7, the inner resonance capacitor VCin2 may be located between the inner distribution capacitor VCin1 and the inner antenna Lin. Also, the outer resonance capacitor VCo2 may be located between the outer distribution capacitor VCo1 and the outer antenna Lo. This configuration also has the above-described advantages (1) to (4).

Figure 8:
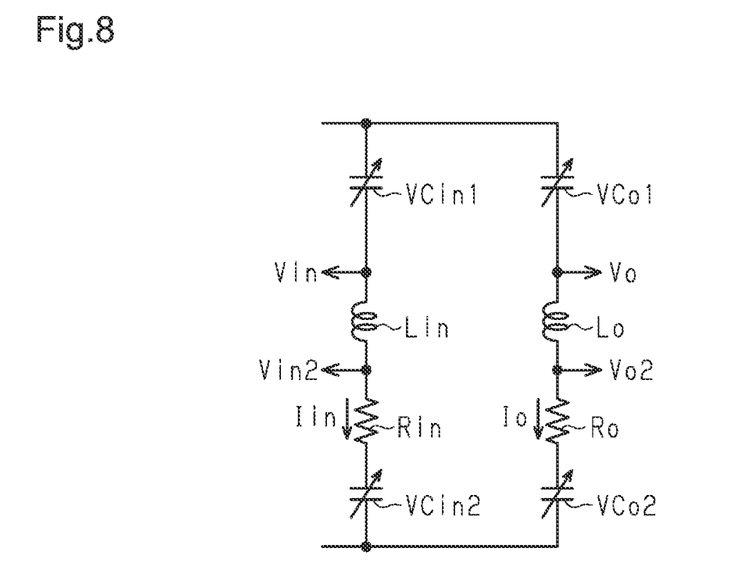
FIG. 8 is a circuit diagram showing the configuration of a high-frequency power circuit in accordance with another modified example.

As shown in FIG. 8, the inner voltage detector 43Vin may separately detect a peak-to-peak voltage Vpp of the inner input terminal voltage Vin and a peak-to-peak voltage Vpp of an inner output terminal voltage Vin2 that is an output terminal voltage at the two terminals of the inner antenna Lin. Further, the length of the inner antenna Lin may be set so that each peak-to-peak voltage Vpp in the inner antenna Lin varies linearly relative to the length of the inner antenna Lin.

When the peak-to-peak voltages Vpp in the inner antenna Lin vary linearly relative to the length of the inner antenna Lin, the voltage distribution, or the resonance point, in the inner antenna Lin can be estimated based on the peak-to-peak voltage Vpp in the inner input terminal voltage Vin and the peak-to-peak voltage Vpp in the inner output terminal voltage Vin2.

In the matching process, the controller 51 may estimate the resonance point in the inner antenna Lin from the detection result of the inner voltage detector 43Vin and output the estimation result to an external device. This allows for estimation of the position of the resonance point in the inner antenna Lin in a state in which plasma is produced. Consequently, the distribution of plasma produced by the inner antenna Lin can be estimated.

Furthermore, in the matching process, the controller 51 may be configured to maintain a combined capacitance of the capacitance of the inner resonance capacitor VCin2 and the capacitance of the inner distribution capacitor VCin1 that are set to reduce the phase difference in the inner antenna Lin. Additionally, the controller 51 may reset (set again) the capacitance of the inner distribution capacitor VCin1 and the capacitance of the inner resonance capacitor VCin2 while maintaining the combined capacitance so that the resonance point coincides with a target position.

In this case, the controller 51 stores new control data in advance for obtaining the target position. The control data is used to output the ratio of the capacitance of the inner distribution capacitor VCin1 and the capacitance of the inner resonance capacitor VCin2 based on an input of the difference between the present resonance point and the target position. Then, the controller 51 may apply the resonance point estimation result and the target position to the control data to reset the capacitance of the inner distribution capacitor VCin1 the capacitance of the inner resonance capacitor VCin2 while maintaining the combined capacitance.

This allows the voltage distribution in the inner antenna Lin to be changed while minimizing the deviation between the actual current distribution ratio and the current distribution ratio that is theoretically obtained in a state in which plasma is not produced. Consequently, the distribution of plasma produced by the inner antenna Lin can be changed.

Further, as shown in FIG. 8, the outer voltage detector 43Vo may separately detect a peak-to-peak voltage Vpp of the outer input terminal voltage Vo and a peak-to-peak voltage Vpp of an outer output terminal voltage Vo2 that is an output terminal voltage at the two terminals of the outer antenna Lo. Further, the length of the outer antenna Lo may be set so that each peak-to-peak voltage Vpp in the outer antenna Lo varies linearly relative to the length of the outer antenna Lo.

With the configuration in which the peak-to-peak voltages Vpp in the outer antenna Lo vary linearly relative to the length of the outer antenna Lo, the voltage distribution, or the resonance point, in the outer antenna Lo can be estimated based on the peak-to-peak voltage Vpp in the outer input terminal voltage Vo and the peak-to-peak voltage Vpp in the outer output terminal voltage Vo2.

In the matching process, the controller 51 may estimate the resonance point in the outer antenna Lo from the detection result of the outer voltage detector 43Vo and output the estimation result to an external device. This allows for estimation of the position of the resonance point in the outer antenna Lo in a state in which plasma is produced. Consequently, the distribution of plasma produced by the outer antenna Lo can be estimated.

Further, in the matching process, the controller 51 may be configured to maintain a combined capacitance of the capacitance of the outer resonance capacitor VCo2 and the capacitance of the outer distribution capacitor VCo1 that are set to reduce the phase difference in the outer antenna Lo. Additionally, the controller 51 may reset (set again) the capacitance of the outer distribution capacitor VCo1 and the capacitance of the outer resonance capacitor VCo2 while maintaining the combined capacitance so that the resonance point corresponds to a target position.

In this case, the controller 51 stores new control data in advance for obtaining the target position. The control data is used to output the ratio of the capacitance of the outer distribution capacitor Vco1 and the capacitance of the outer resonance capacitor Vco2 based on an input of the difference between the present resonance point and the target position. Then, the controller 51 may apply the resonance point estimation result and the target position to the control data to reset the capacitance of the outer distribution capacitor Vco1 and the capacitance of the outer resonance capacitor Vco2 while maintaining the combined capacitance.

This allows the voltage distribution in the outer antenna Lo to be changed while minimizing the deviation between the actual current distribution ratio and the current distribution ratio that is theoretically obtained in a state in which plasma is not produced. Consequently, the distribution of plasma produced by the outer antenna Lo can be changed.

The inner antenna Lin is not limited to an antenna having an annular shape and may be changed to have any of a variety of shapes, for example, the antenna may be linear. The outer antenna Lo is not limited to an antenna having an annular shape and may be changed to have any of a variety of shapes, for example, the antenna may be linear.

The invention claimed is:

1. A high-frequency power circuit, comprising:
a first antenna circuit in which first circuit elements are connected in series;
a second antenna circuit in which second circuit elements are connected in series, wherein the first antenna circuit and the second antenna circuit are connected in parallel to a matching box that is connected to a high-frequency power supply; and
a controller that controls and drives the first circuit elements and the second circuit elements, wherein
the first circuit elements include a first antenna for plasma production, a first distribution capacitor located between the first antenna and the matching box, and a first variable capacitor,
the second circuit elements include a second antenna for plasma production, a second distribution capacitor located between the second antenna and the matching box, and a second variable capacitor,
the controller sets a capacitance of the first variable capacitor based on a detection result of a phase difference between current and voltage in a series-connected portion of the first antenna and the first variable capacitor during plasma production so as to reduce the phase difference between current and voltage in the series-connected portion of the first antenna and the first variable capacitor, and
the controller sets a capacitance of the second variable capacitor based on a detection result of a phase difference between current and voltage in a series-connected portion of the second antenna and the second variable capacitor during plasma production so as to reduce the phase difference between current and voltage in the series-connected portion of the second antenna and the second variable capacitor.

2. The high-frequency power circuit according to claim 1, wherein
the first antenna is located between the first distribution capacitor and the first variable capacitor, and
the second antenna is located between the second distribution capacitor and the second variable capacitor.

3. The high-frequency power circuit according to claim 1, wherein
the first variable capacitor is located between the first distribution capacitor and the first antenna, and
the second variable capacitor is located between the second distribution capacitor and the second antenna.

4. The high-frequency power circuit according to claim 1, comprising:
a first current detector that detects current in the first antenna;
a first voltage detector that detects voltage at the first antenna;
a second current detector that detects current in the second antenna; and
a second voltage detector that detects voltage at the second antenna, wherein
based on a detection result of the first current detector and the first voltage detector, the controller sets the capacitance of the first variable capacitor so as to match a phase of current with a phase of voltage in the series-connected portion of the first antenna and the first variable capacitor, and
based on a detection result of the second current detector and the second voltage detector, the controller sets the capacitance of the second variable capacitor so as to match a phase of current with a phase of voltage in the series-connected portion of the second antenna and the second variable capacitor.

5. The high-frequency power circuit according to claim 4, wherein
   each of the first distribution capacitor and the second distribution capacitor is a variable capacitor,
   the controller performs a process for setting a target value for a ratio of a current value of the first antenna and a current value of the second antenna before the high-frequency power supply provides power, and
   the process includes driving the first distribution capacitor in cooperation with the second distribution capacitor and setting the capacitance of each of the first distribution capacitor and the second distribution capacitor such that the capacitance of the second distribution capacitor decreases as the capacitance of the first distribution capacitor increases.

6. The high-frequency power circuit according to claim 5, wherein
   the first voltage detector separately detects voltage at each of two terminals of the first antenna, and
   the controller resets the capacitance of the first variable capacitor and the capacitance of the first distribution capacitor so as to change voltage distribution in the first antenna obtained from a detection result of the first voltage detector while maintaining a combined capacitance of the capacitance of the first variable capacitor and the capacitance of the first distribution capacitor that are set to reduce the phase difference between current and voltage in the series-connected portion of the first antenna and the first variable capacitor based on the detection result of the phase difference between current and voltage in the series-connected portion of the first antenna and the first variable capacitor.

7. The high-frequency power circuit according to claim 6, wherein
   the second voltage detector separately detects voltage at each of two terminals of the second antenna, and
   the controller resets the capacitance of the second variable capacitor and the capacitance of the second distribution capacitor so as to change voltage distribution in the second antenna obtained from a detection result of the second voltage detector while maintaining a combined capacitance of the capacitance of the second variable capacitor and the capacitance of the second distribution capacitor that are set to reduce the phase difference between current and voltage in the series-connected portion of the second antenna and the second variable capacitor based on the detection result of the phase difference between current and voltage in the series-connected portion of the second antenna and the second variable capacitor.

8. A plasma treatment apparatus, comprising:
   a vacuum chamber; and
   a high-frequency power circuit arranged outside the vacuum chamber to produce plasma,
   wherein the high-frequency power circuit is the high-frequency power circuit according to claim 1.

9. A plasma treatment method, comprising:
   supplying a gas into a vacuum chamber; and
   supplying high-frequency power to the vacuum chamber from a high-frequency power circuit, wherein
   the high-frequency power circuit includes
      a first antenna circuit in which first circuit elements are connected in series, and
      a second antenna circuit in which second circuit elements are connected in series,
   the first antenna circuit and the second antenna circuit are connected in parallel to a matching box that is connected to a high-frequency power supply,
   the first circuit elements include a first antenna for plasma production, a first distribution capacitor located between the first antenna and the matching box, and a first variable capacitor,
   the second circuit elements include a second antenna for plasma production, a second distribution capacitor located between the second antenna and the matching box, and a second variable capacitor, and
   the supplying the high-frequency power includes
      setting a capacitance of the first variable capacitor based on a detection result of a phase difference between current and voltage in a series-connected portion of the first antenna and the first variable capacitor so as to reduce the phase difference between current and voltage in a series-connected portion of the first antenna and the first variable capacitor, and
      setting a capacitance of the second variable capacitor based on a detection result of a phase difference between current and voltage in a series-connected portion of the second antenna and the second variable capacitor so as to reduce the phase difference between current and voltage in a series-connected portion of the second antenna and the second variable capacitor.

\* \* \* \* \*